United States Patent
Kondo

(10) Patent No.: US 10,249,513 B2
(45) Date of Patent: *Apr. 2, 2019

(54) ELECTRONIC DEVICE, ELECTRONIC APPARATUS, MOVING OBJECT, AND METHOD FOR MANUFACTURING ELECTRONIC DEVICE

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/667,076

(22) Filed: Aug. 2, 2017

(65) Prior Publication Data

US 2017/0330766 A1 Nov. 16, 2017

Related U.S. Application Data

(63) Continuation of application No. 14/217,969, filed on Mar. 18, 2014, now Pat. No. 9,754,803.

(30) Foreign Application Priority Data

Mar. 27, 2013 (JP) .................................. 2013-065758
Mar. 29, 2013 (JP) .................................. 2013-071660

(51) Int. Cl.
*H01L 21/48* (2006.01)
*H01L 23/34* (2006.01)
(Continued)

(52) U.S. Cl.
CPC .......... *H01L 21/4842* (2013.01); *H01L 21/56* (2013.01); *H01L 23/3185* (2013.01);
(Continued)

(58) Field of Classification Search
CPC .... H05K 1/021; H05K 1/0212; H05K 1/0215; H05K 1/023; H05K 1/0231;
(Continued)

(56) References Cited

U.S. PATENT DOCUMENTS 5,359,494 A   10/1994   Morimoto
5,438,305 A *  8/1995   Hikita ..................... H01L 23/66
                                                174/551

(Continued)

FOREIGN PATENT DOCUMENTS

JP    2004-047775 A    2/2004
JP    2005-150786 A    6/2005
(Continued)

OTHER PUBLICATIONS

Feb. 26, 2016 Office Action Issued in U.S. Appl. No. 14/217,969.
(Continued)

*Primary Examiner* — Pete T Lee
(74) *Attorney, Agent, or Firm* — Oliff PLC

(57) ABSTRACT

An electronic device includes: an electronic component including an external connection terminal; and a lead frame (metal member) connected to the external connection terminal. The lead frame is disposed with a pad. The pad overlaps the external connection terminal in plan view, and at least a portion of the pad is located outside the external shape of the electronic component in plan view. The pad and the external connection terminal are connected by means of a conductive bonding member. The pad and the electronic component are bonded together with a resin. The resin extends to a region of the pad located outside the external shape of the electronic component in plan view.

12 Claims, 9 Drawing Sheets

(51) Int. Cl.
*H01L 23/495* (2006.01)
*H01L 23/31* (2006.01)
*H01L 21/56* (2006.01)
*H03H 9/10* (2006.01)
H01L 23/00 (2006.01)

(52) U.S. Cl.
CPC ...... *H01L 23/345* (2013.01); *H01L 23/49572* (2013.01); *H03H 9/10* (2013.01); *H01L 24/81* (2013.01); *H01L 2224/16245* (2013.01); *H01L 2224/8192* (2013.01); *H01L 2224/81192* (2013.01); *H01L 2224/81815* (2013.01); *H01L 2224/83102* (2013.01); *Y10T 29/4913* (2015.01)

(58) Field of Classification Search
CPC .. H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 2201/0129; H05K 2201/0195; H05K 2201/023; H05K 2201/0239; H05K 3/321; H01L 21/4842; H01L 23/345; H01L 23/49572; H01L 23/3138; H01L 21/56; H01L 24/81; H01L 2224/16245; H01L 2224/81192; H01L 2224/81815; H01L 2224/8192; H01L 2224/83102; H03H 9/10; Y10T 29/4913
See application file for complete search history.

(56) References Cited

U.S. PATENT DOCUMENTS

| | | | |
|---|---|---|---|
| 5,946,195 A | 8/1999 | Hashimoto | |
| 6,754,950 B2 * | 6/2004 | Furukawa | H01L 21/56 257/E21.502 |
| 2002/0005293 A1 | 1/2002 | Murakami | |
| 2004/0245895 A1 | 12/2004 | Shimodaira et al. | |
| 2005/0040734 A1 * | 2/2005 | Kinoshita | G01C 19/56 310/348 |
| 2005/0257954 A1 | 11/2005 | Aoyagi | |
| 2005/0264140 A1 | 12/2005 | Miyazaki | |
| 2006/0290236 A1 | 12/2006 | Ikehashi | |
| 2010/0283144 A1 | 11/2010 | Liang | |
| 2011/0271760 A1 | 11/2011 | Ohkoshi et al. | |

FOREIGN PATENT DOCUMENTS

| | | |
|---|---|---|
| JP | 2007-006270 A | 1/2007 |
| JP | 2010-166346 A | 7/2010 |
| JP | 2010-199678 A | 9/2010 |
| JP | 2010-226397 A | 10/2010 |
| JP | 2011-029403 A | 2/2011 |

OTHER PUBLICATIONS

Aug. 11, 2016 Office Action issued in U.S. Appl. No. 14/217,969.
Feb. 10, 2017 Office Action issued in U.S. Appl. No. 14/217,969.
May 22, 2017 Notice of Allowance issued in U.S. Appl. No. 14/217,969.

* cited by examiner

ELECTRONIC DEVICE, ELECTRONIC APPARATUS, MOVING OBJECT, AND METHOD FOR MANUFACTURING ELECTRONIC DEVICE

CROSS REFERENCE TO RELATED APPLICATION

This application is a continuation of U.S. patent application Ser. No. 14/217,969, filed Mar. 18, 2014, which claims the priority benefit of Japanese Patent Application Nos. 2013-65758, filed Mar. 27, 2013 and 2013-71660, filed Mar. 29, 2013. The contents of these three applications are expressly incorporated by reference in their entirety.

BACKGROUND

1. Technical Field

The present invention relates to an electronic device, an electronic apparatus, a moving object, and a method for manufacturing an electronic device.

2. Related Art

As an example of piezoelectric oscillators including a piezoelectric resonator, there is a crystal oscillator including a quartz crystal resonator. As typical configurations for obtaining frequency stability against the temperature of the quartz crystal oscillator, a temperature compensated crystal oscillator (TCXO) and an oven controlled crystal oscillator (OCXO) have been known. The TCXO is configured such that a temperature compensated circuit using a thermosensor is incorporated to correct an oscillating frequency based on the temperature detected value of the thermosensor. The TCXO has advantages in that it has low power consumption, and is generally small in size and light in weight, compared to the OCXO described later. However, the TCXO is susceptible to an ambient temperature compared to the OCXO, and therefore, it is difficult to apply the TCXO when high frequency-stability is required.

On the other hand, the OCXO has a structure in which a quartz crystal resonator is at a constant temperature by heating with a heating element such as, for example, a heater to maintain the constant ambient temperature of the quartz crystal resonator. However, the OCXO needs a structure to reduce the power consumption of the heater by preventing the heat of the quartz crystal resonator from escaping to the outside.

Japanese Patent No. 4804813 (Patent Document 1) discloses a configuration in which a quartz crystal resonator to which a resistance heating element and a thermosensor are attached is connected to a board via a lead frame to thereby be supported by the lead frame in a state where the quartz crystal resonator floats above the board. JP-A-2010-199678 (Patent Document 2) discloses the following configuration. An electrode of a quartz crystal resonator accommodated in a package is connected to a through-electrode formed in the package, and a lead frame is connected to a portion of the package where the through-electrode is exposed. The package is connected to a board via the lead frame, so that the package is supported in a state of floating above the board. With the configuration disclosed in Patent Document 1, it is possible to reduce the conduction of heat of the quartz crystal resonator to the board side. With the configuration disclosed in Patent Document 2, it is possible to reduce the conduction of heat of the package including the quartz crystal resonator to the board side.

In the related art, however, in the connection between the electrode of the quartz crystal resonator and the lead frame and in the connection between the electrode on the board and the lead frame, the bonding area of the lead frame is the width of the lead frame itself at most. Therefore, the connection strength may be insufficient. For increasing the connection strength between the quartz crystal resonator and the lead frame, there is a method of disposing a castellation in the quartz crystal resonator to form a fillet at a connecting portion between the quartz crystal resonator and the lead frame. This method can increase the connection strength between the quartz crystal resonator and the lead frame, but the strength of the quartz crystal resonator itself may be lowered because a recess is disposed in the quartz crystal resonator, that is, the package by disposing the castellation.

SUMMARY

An advantage of some aspects of the invention is to provide an electronic device capable of increasing the bonding strength between an electronic component and a metal member without lowering the mechanical strength of the electronic component, an electronic apparatus and a moving object both using the electronic device, and a method for manufacturing an electronic device.

The invention can be implemented as the following forms or application examples.

Application Example 1

This application example is directed to an electronic device including: an electronic component including an external connection terminal; and a metal member connected to the external connection terminal, wherein the metal member is disposed with a pad, the pad overlapping the external connection terminal in plan view, at least a portion of the pad being located outside the external shape of the electronic component in plan view, the pad and the external connection terminal are connected by means of a conductive bonding member, and the pad and the electronic component are bonded together with a resin, the resin extending to a region of the pad located outside the external shape of the electronic component in plan view.

The resin in the form of a liquid before curing is introduced by capillary action into a gap between the electronic component (external connection terminal) and the pad. With the configuration described above, therefore, the portion of the pad protruding from the external shape of the electronic component in plan view can be used as a guide for introducing the resin into the gap between the external connection terminal and the pad, so that the resin can be easily introduced into the gap in the electronic device.

Moreover, the resin reinforces the connection between the electronic component and the pad, and the resin is present around the conductive bonding member. Since the resin is located outside a region where the pad and the electronic component overlap each other, the bonding area of the resin to the pad can be increased. Hence, the mechanical connection between the electronic component and the pad can be further strengthened, so that the bonding of the electronic component with the metal member can be realized with high reliability in the electronic device.

Application Example 2

This application example is directed to the electronic device according to Application Example 1, wherein the pad covers the external connection terminal in plan view.

With the configuration described above, the area of bonding between the external connection terminal and the pad by means of the conductive bonding member is assured while keeping the strong mechanical connection between the electronic component and the pad, so that the electrical connection between the external connection terminal and the pad can be further strengthened.

Application Example 3 and Application Example 4

These application examples are directed to the electronic device according to Application Examples 1 and 2, respectively, wherein the resin covers at least a portion of a side surface of the electronic component.

With the configuration described above, the bonding area of the resin to the pad and the bonding area of the resin to the electronic component can be increased to further strengthen the mechanical connection between the electronic component and the pad.

Application Example 5, Application Example 6, and Application Example 7

These application examples are directed to the electronic devices according to Application Examples 1 to 3, respectively, wherein the resin is a thermosetting resin.

With the configuration described above, the electronic component and the pad can be easily bonded together with the resin.

Application Example 8

This application example is directed to an electronic apparatus including the electronic device according to Application Example 1.

With the configuration described above, the bonding of the electronic component with the metal member is realized with high strength in the electronic apparatus.

Application Example 9

This application example is directed to a moving object including the electronic device according to Application Example 1.

With the configuration described above, the bonding of the electronic component with the metal member is realized with high strength in the moving object.

Application Example 10

This application example is directed to a method for manufacturing an electronic device in which a metal member is connected to an external connection terminal of an electronic component, the method including: forming a pad at the metal member; connecting the pad and the external connection terminal by means of a conductive bonding member such that the pad and the external connection terminal overlap each other in plan view, and that at least a portion of the pad is located outside the external shape of the electronic component in plan view; and bonding the pad and the electronic component together with a resin and extending the resin to a region of the pad located outside the external shape of the electronic component in plan view.

The resin in the form of a liquid before curing is introduced by capillary action into a gap between the electronic component (external connection terminal) and the pad. With the configuration described above, therefore, the portion of the pad protruding from the external shape of the electronic component in plan view can be used as a guide for flowing the resin into the gap between the external connection terminal and the pad, so that the resin can be easily introduced into the gap.

Moreover, the resin reinforces the connection between the electronic component and the pad, and the resin is present around the conductive bonding member. Since the resin is located outside a region where the pad and the electronic component overlap each other, the bonding area of the resin to the pad can be increased. Hence, the mechanical connection between the electronic component and the pad can be further strengthened, so that the bonding of the electronic component with the metal member can be realized with high reliability.

Application Example 11

This application example is directed to the method for manufacturing the electronic device according to Application Example 10, further including, after the extending of the resin, bending the metal member at a position overlapping an external shape line of the resin in plan view.

With the method described above, the metal member can be easily bent without applying a mechanical load to the conductive bonding member.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
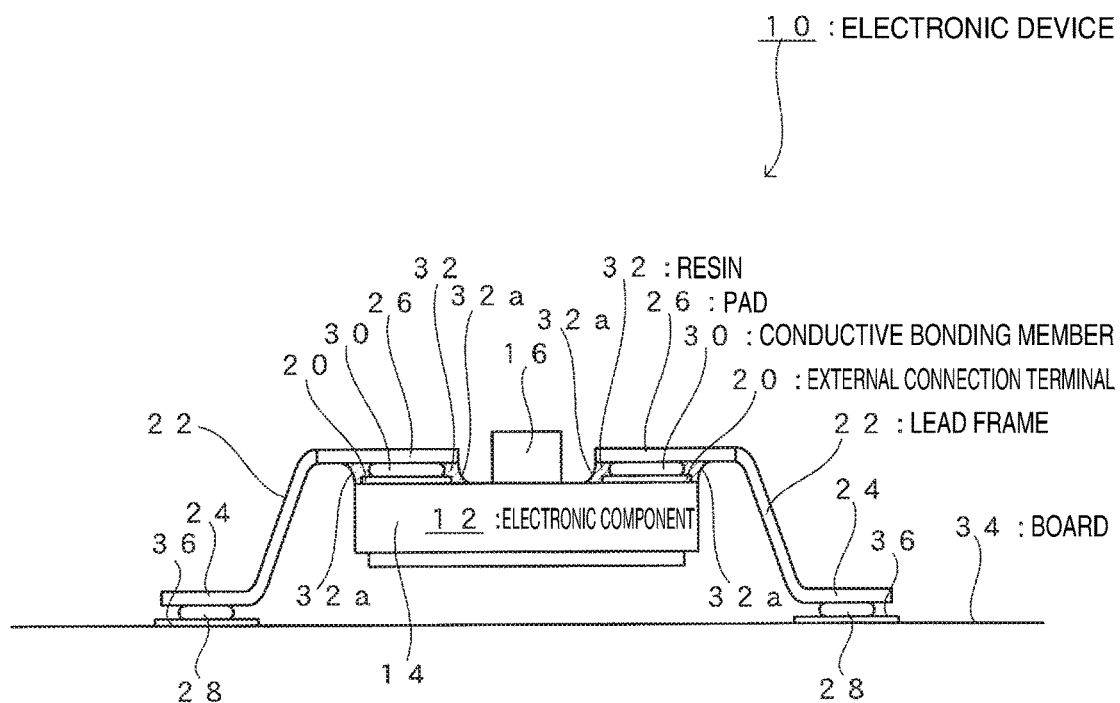
FIG. 1 is a side view of an electronic device of a first embodiment.

Hereinafter, the invention will be described in detail using embodiments shown in the drawings. However, constituent elements, kinds, combinations, shapes, relative arrangements thereof, and the like described in the embodiments are not intended to limit the scope of the invention but are merely explanatory examples unless a specific description is provided.

First Embodiment

Figure 2:
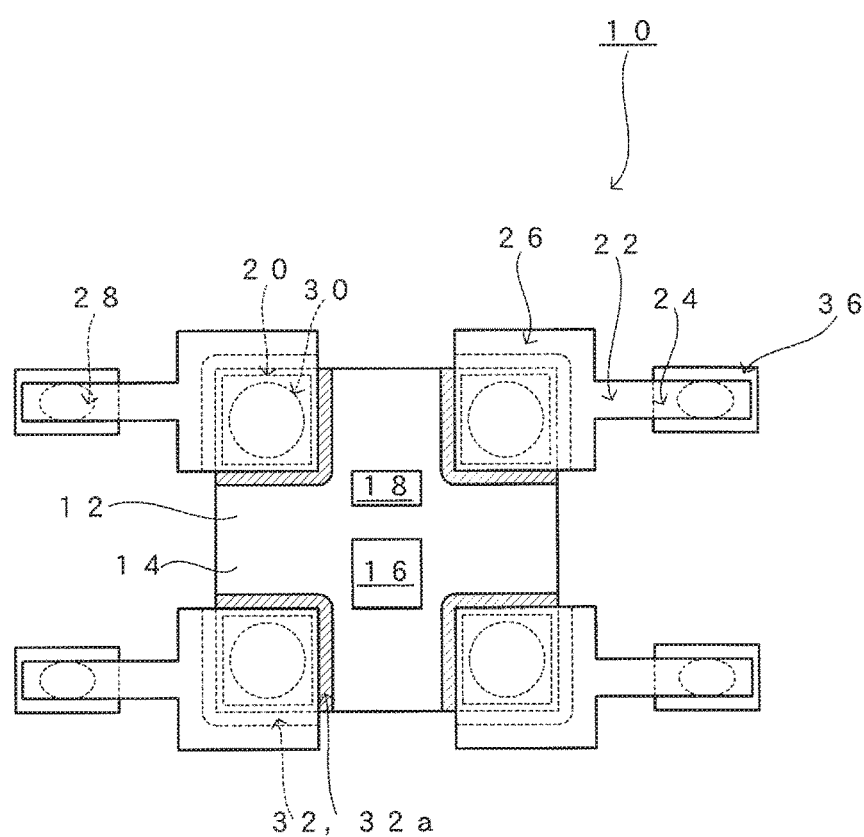
FIG. 2 is a plan view of the electronic device of the first embodiment.
Figure 3:
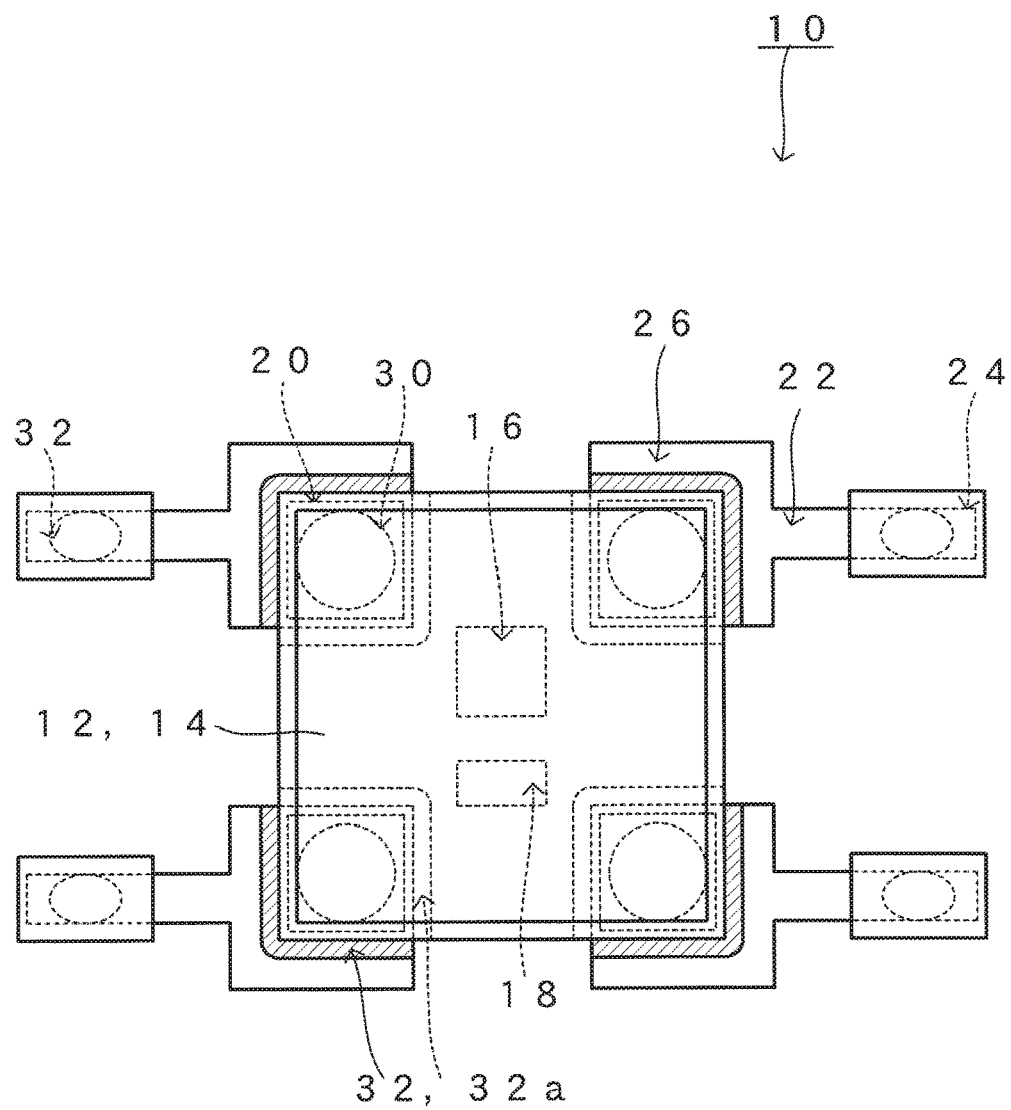
FIG. 3 is a bottom plan view of the electronic device of the first embodiment.

FIG. 1 shows a side view of an electronic device of a first embodiment. FIG. 2 shows a plan view of the electronic device of the first embodiment. FIG. 3 shows a bottom plan view of the electronic device of the first embodiment. FIG. 3 shows the electronic device by seeing through a board 34. As shown in FIG. 1, the electronic device 10 of the embodiment is mounted on the board 34 as a mounting destination and composed mainly of an electronic component 12 and lead frames 22 as an example of metal members attached to the electronic component 12.

Features of First Embodiment

The electronic device 10 of the embodiment has the following features. A pad 26 is disposed at an end of the lead frame 22. The pad 26 and an external connection terminal 20 are connected by means of a conductive bonding member 30. The pad 26 overlaps the external connection terminal 20 in plan view. A portion of the external shape of the pad 26 is located outside the external shape of the electronic component 12. The pad 26 and the external connection terminal 20 are bonded together with a resin 32. The resin 32 extends, in plan view, outside a region where the pad 26 and the electronic component 12 overlap each other.

The resin 32 in the form of a liquid before curing is introduced by capillary action into a gap between the electronic component 12 (the external connection terminal 20) and the pad 26. With the configuration described above, therefore, the portion of the pad 26 protruding from the external shape of the electronic component 12 in plan view can be used as a guide for introducing the resin 32 into the gap between the external connection terminal 20 and the pad 26, so that the resin 32 can be easily introduced into the gap.

Moreover, the resin 32 reinforces the connection between the electronic component 12 and the pad 26, and the resin 32 is present around the conductive bonding member 30. Since the resin 32 is located outside the region where the pad 26 and the electronic component 12 overlap each other, the bonding area of the resin 32 to the pad 26 can be increased. Hence, the mechanical connection between the electronic component 12 and the pad 26 can be further strengthened, so that the bonding of the electronic component 12 with the lead frame 22 can be realized with high reliability.

Electronic Component

The external shape of the electronic component 12 is formed of a package 14. For example, a resonator element (not shown) is accommodated in the package 14. As the resonator element, it is possible to apply a tuning fork-type piezoelectric resonator element, a double tuning fork-type piezoelectric resonator element, an AT-cut resonator element, a double T-type gyro sensor, or the like whose main body is quartz crystal. It is also possible to apply a tuning fork-type resonator element or the like whose main body is silicon or the like and that has a piezoelectric material arranged on the surface of the main body. The embodiment is described on the assumption that the electronic component 12 is the OCXO described above. However, the TCXO described above, a gyro sensor, or the like can also be applied. A heater 16 and a thermistor 18 (FIGS. 2 and 3) for OCXO are attached to an upper surface of the electronic component 12. Also, the external connection terminals 20 electrically connected to the resonator element (not shown), the heater 16, and the thermistor 18 are disposed on the upper surface of the electronic component 12. As many external connection terminals 20 (four in the embodiment) as the number of electrodes that are needed for the elements to be mounted, such as the resonator element (not shown), the heater 16, and the thermistor 18, are disposed.

Lead Frame

The lead frame 22 is a conductive member having a shape bending in the height direction. The lead frame 22 is composed of an elongated lead portion 24 and the pad 26 that is connected to an end of the lead portion 24 on the external connection terminal 20 side and wider than the lead portion 24. The pad 26 is arranged such that the external shape thereof includes therein the external shape of the external connection terminal 20 of the electronic component 12 in plan view, and that a portion of the external shape of the pad 26 protrudes from the external shape of the electronic component 12 in plan view.

The lead frame 22 is bent into a mountain shape at a boundary between the pad 26 and the lead portion 24 of the lead frame 22 and bent into a valley shape in the vicinity of the tip of the lead portion 24. The tip portion of the lead portion 24 is connected to a mounting electrode 36 on the board 34, and the pad 26 is connected to the external connection terminal 20 of the electronic component 12. In the embodiment, a chevron-shaped form is provided in the height direction of the board 34 with the lead frame 22 located on the left side of FIG. 1 and the lead frame 22 located on the right side thereof. With this configuration, the electronic component 12 is suspended by the lead frames 22 and floats above the board 34. Since the mountain shape and the valley shape described above are formed in a shape in which a given curvature is maintained, a concentration of stress on the mountain-shaped portion and the valley-shaped portion is avoided.

For the material of the lead frame 22, a material having conductivity and a low thermal conductivity, such as 42 alloy or Kovar for example, is preferable when the electronic component 12 is an OCXO. With this material, it is possible to reduce the dissipation of heat that is supplied from the heater 16 to the electronic component 12 (the inside resonator element) through the lead frame 22. Of course, a material (for example, copper) other than the materials described above can also be used. Moreover, the width of the lead portion 24 is preferably sufficiently smaller than the width of the pad 26. For example, when the pad 26 is formed to have a width of from 1 to 2 mm, the width of the lead portion 24 is preferably from about 0.3 to 0.6 mm.

Conductive Bonding Member and Resin

The tip portion of the lead portion 24 and the mounting electrode 36 are bonded together with a conductive bonding member 28 (for example, solder). Similarly, the pad 26 and the external connection terminal 20 are bonded together with the conductive bonding member 30 (for example, solder). Further, the gap formed due to the conductive bonding member 30 between the electronic component 12 and the pad 26 is sealed by the resin 32, and the resin 32 is present around the conductive bonding member 30. In FIG. 1 and the like, the external connection terminal 20 and the conductive bonding member 30 are illustrated to be exposed from the resin 32 in order to facilitate visibility.

Before curing, the resin 32 enters the gap between the pad 26 and the electronic component 12 by capillary action. On the other hand as described above, the pad 26 is arranged such that a portion thereof protrudes from the external shape of the electronic component 12 in plan view. Therefore, the protruding portion serves as a guide for introducing the resin 32 into the gap, so that the resin 32 can be easily introduced. Moreover, the resin 32 extends, not only to the gap, but also to a position of the pad 26 overlapping the edge portion of the external shape of the electronic component 12 in plan view (FIGS. 2 and 3). The extending portion of the resin forms a fillet 32a having a curved surface shape as shown in FIG. 1. The surface of the fillet 32a is a concave curved surface. With this configuration, the bonding area of the resin 32 to the pad 26 can be increased to further strengthen the mechanical connection between the electronic component 12 and the pad 26. The fillet 32a is also formed on the facing edge sides of the pads 26 that are different from each other.

When a low melting point solder is used for the conductive bonding member 30, the solder melts in some cases in a reflow step (a step of connecting the electronic device 10 to the board 34, a step of arranging the electronic device in an electronic apparatus (a highly functional mobile phone 100 or the like described later), or the like). However, even when the solder melts, the bonding of the lead frame 22 with the external connection terminal 20 can be maintained by bonding the lead frame 22 and the external connection terminal 20 together with the resin 32 around the solder. Moreover, for the resin 32, a thermosetting resin such as an epoxy-based resin is preferably used. For the thermosetting resin, a thermosetting resin having a curing temperature lower than the melting point of the conductive bonding member 30 is preferably used.

Manufacturing Steps

Figure 4:
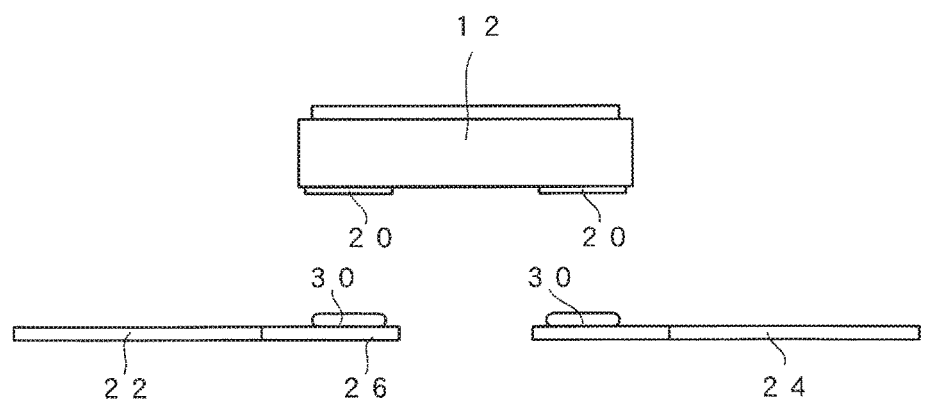
FIG. 4 shows a manufacturing step (before soldering) of the electronic device of the first embodiment.
Figure 5:
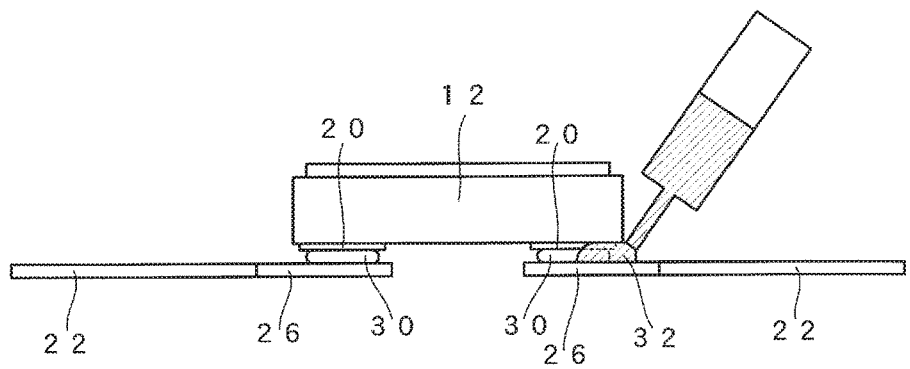
FIG. 5 shows a manufacturing step (introduction of a resin) of the electronic device of the first embodiment.

FIGS. 4 to 9 show manufacturing steps of the electronic device of the first embodiment. As shown in FIG. 4, the electronic component 12 and the lead frames 22 before bending are formed, and the conductive bonding member 30 (solder) is applied to the pad 26 of the lead frame 22 using a printing technique or the like. As shown in FIG. 5, the pad 26 and the external connection terminal 20 are connected by means of the conductive bonding member 30. Then, as shown in FIG. 5, the resin 32 is introduced into the gap formed due to the conductive bonding member 30 between the pad 26 and the external connection terminal 20. In this case, even when the resin 32 is introduced toward the portion of the pad 26 protruding from the external shape of the electronic component 12 in plan view, the resin 32 that has reached the gap is introduced into the gap by capillary action.

Figure 6:
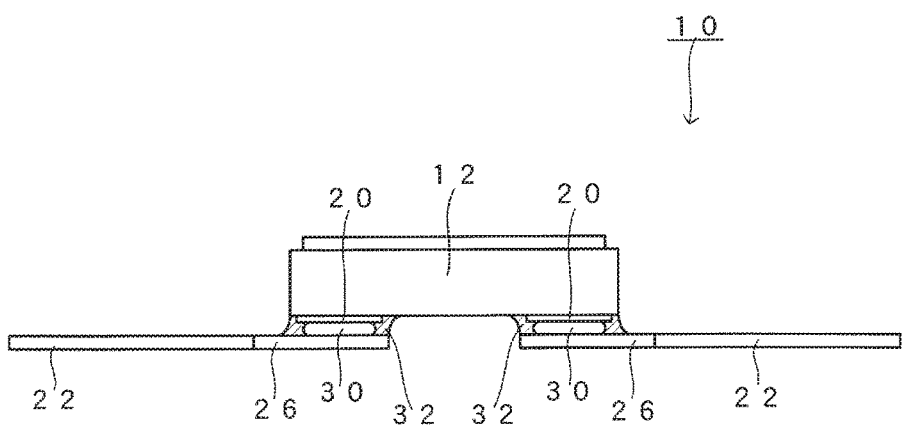
FIG. 6 shows a manufacturing step (after thermal curing) of the electronic device of the first embodiment.
Figure 7:
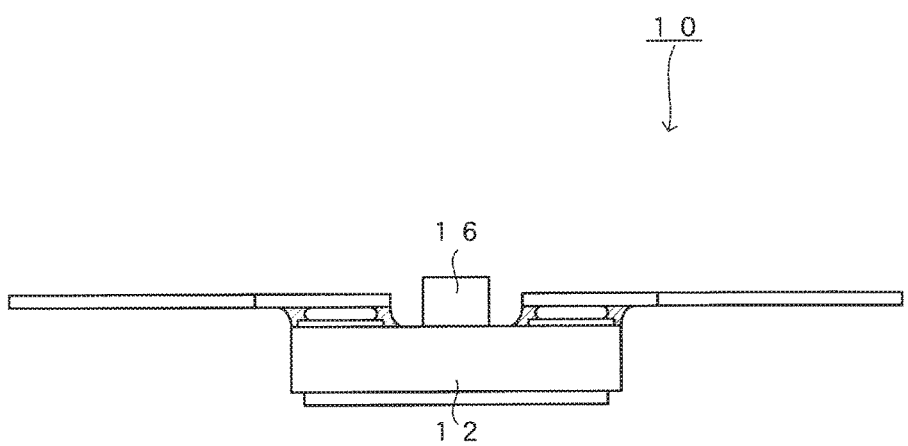
FIG. 7 shows a manufacturing step (attachment of a heater and the like) of the electronic device of the first embodiment.

As shown in FIG. 6, after introducing the resin 32 into all of the gaps between the pads 26 and the external connection terminals 20, the resin 32 is heated and cured. As shown in FIG. 7, the heater 16 and the thermistor 18 (refer to FIG. 2) are attached to the upper surface of the electronic component 12. With these steps, the electronic device 10 before bending the lead frames 22 is formed.

Figure 8:
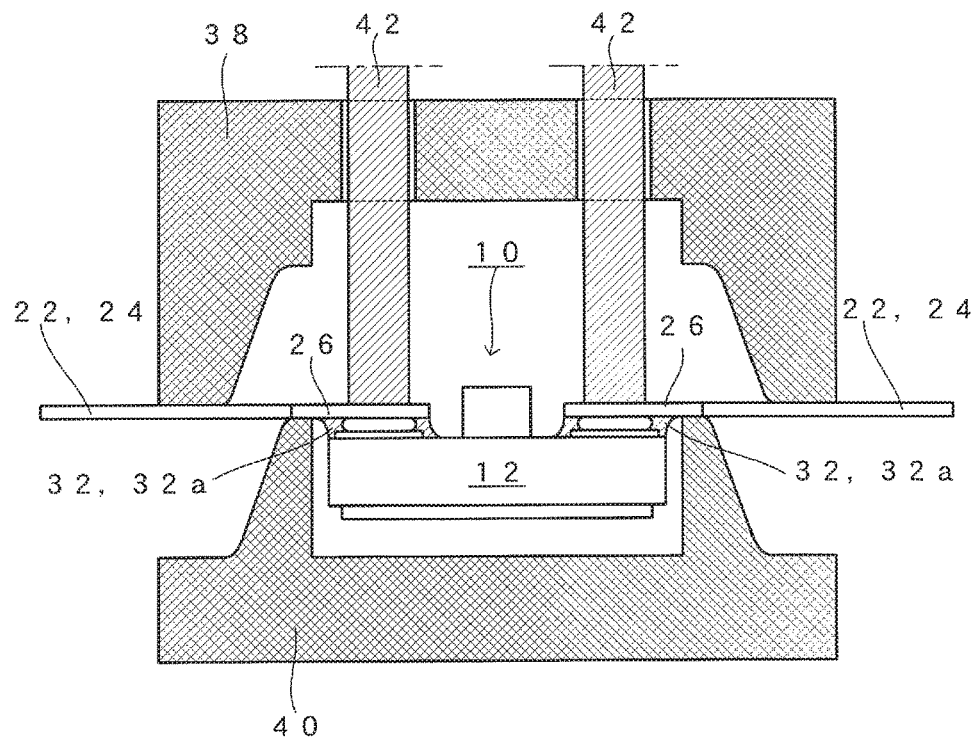
FIG. 8 shows a manufacturing step (arrangement between dies) of the electronic device of the first embodiment.
Figure 9:
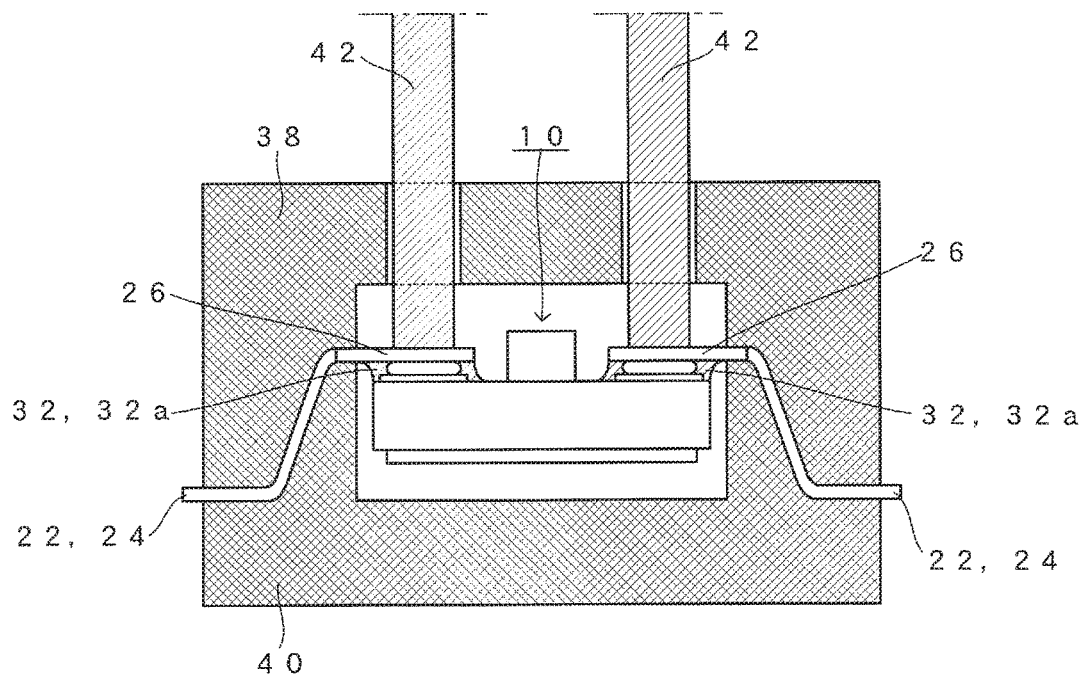
FIG. 9 shows a manufacturing step (bending of a lead frame) of the electronic device of the first embodiment.

Next, as shown in FIG. 8, the electronic device 10 is arranged between a die 38 and a die 40 respectively having mating surfaces conforming to the bending shape of the lead frame 22, and the electronic device 10 (the electronic component 12) is fixed on the die 40 side with pressing members 42. Then, as shown in FIG. 9, a force is applied in a direction in which the die 38 and the die 40 are mated with each other, while pressing the electronic device 10 with the pressing members 42, to deform the lead frame 22. With this step, the electronic device 10 shown in FIGS. 1, 2, and 3 is formed. As shown in FIG. 9, the lead frame 22 is bent in the first embodiment so as to have an acute angle on the side thereof where the resin 32 is applied. Although the lead frame 22 can be bent at the boundary between the pad 26 and the lead portion 24 as shown in FIG. 9, the lead frame 22 can also be bent at a portion overlapping an external shape line of the resin 32 (the fillet 32a) in plan view. In this case, stress can be concentrated on the pad 26 at a position facing the boundary of the resin 32 (the fillet 32a), so that the pad 26 can be easily bent. In any of these cases, however, the lead frame 22 can be easily bent without applying a mechanical load to the conductive bonding member 30.

Second Embodiment

Figure 10:
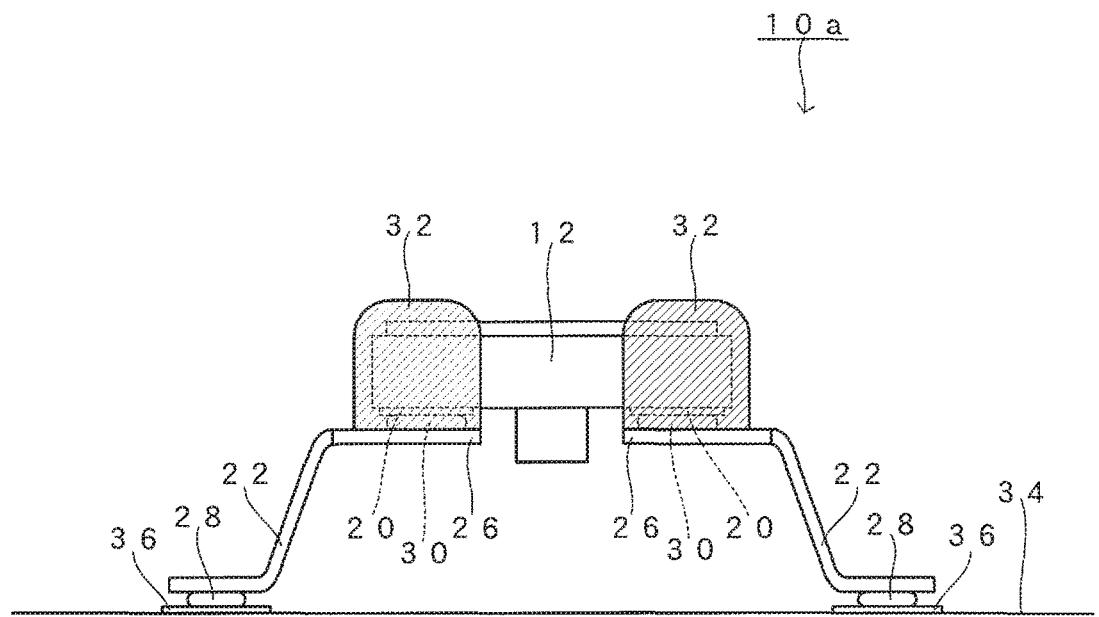
FIG. 10 is a side view of an electronic device of a second embodiment.
Figure 11:
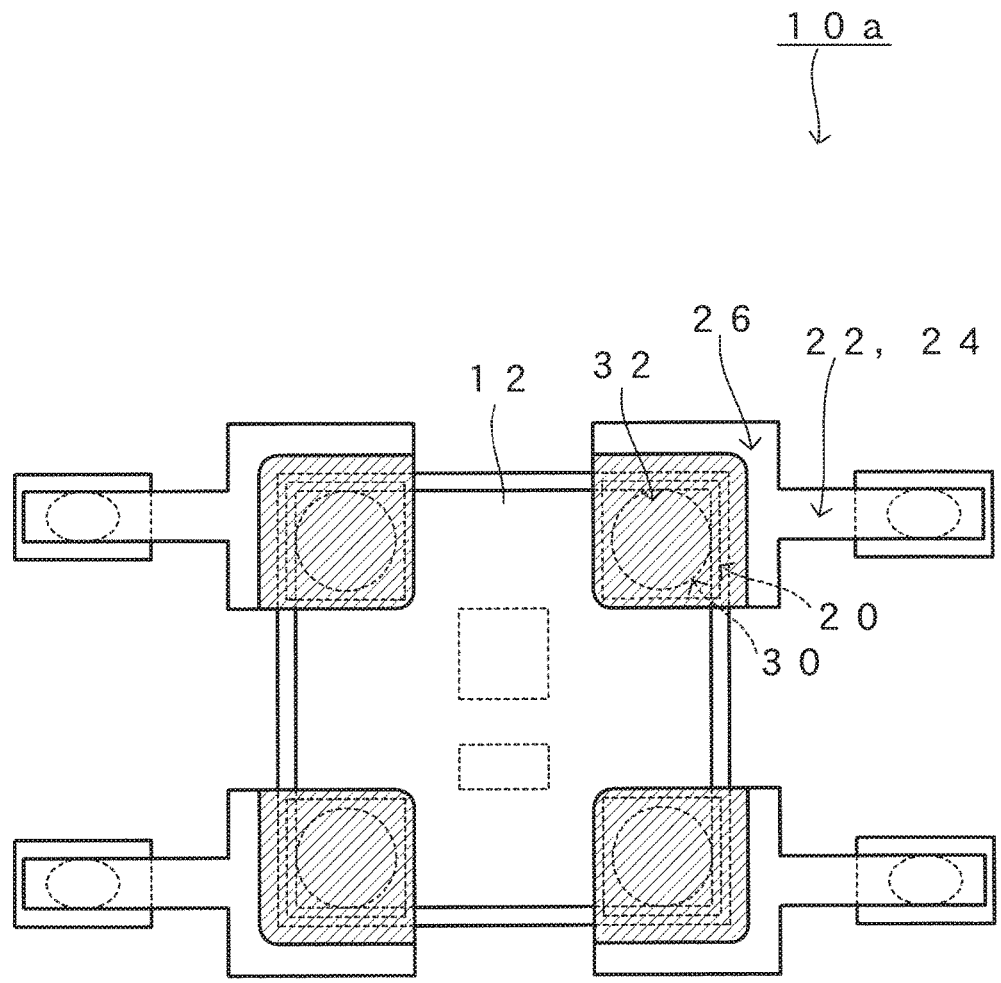
FIG. 11 is a plan view of the electronic device of the second embodiment.

FIG. 10 shows a side view of an electronic device of a second embodiment. FIG. 11 shows a plan view of the electronic device of the second embodiment. In the embodiment, constituent elements common to the first embodiment are denoted by the same reference numerals and signs, and the description thereof is omitted except when necessary. The basic configuration of the electronic device 10a of the second embodiment is similar to that of the first embodiment, but the electronic component 12 is connected to the upper surfaces of the pads 26. The resin 32 is present between the pad 26 and the external connection terminal 20 and around the conductive bonding member 30. The resin 32 extends to a position overlapping the edge portion of the external shape of the electronic component 12 on the pad 26 in plan view, and covers at least a portion of a side surface of the electronic component 12. Further, the resin 32 is formed so as to cover the side surface around a corner portion of the electronic component 12 and a portion of the upper surface thereof. With this configuration, the bonding area of the resin 32 to the pad 26 and the bonding area of the resin 32 to the electronic component 12 can be increased to further strengthen the mechanical connection between the electronic component 12 and the pad.

Manufacturing Steps

Figure 12:
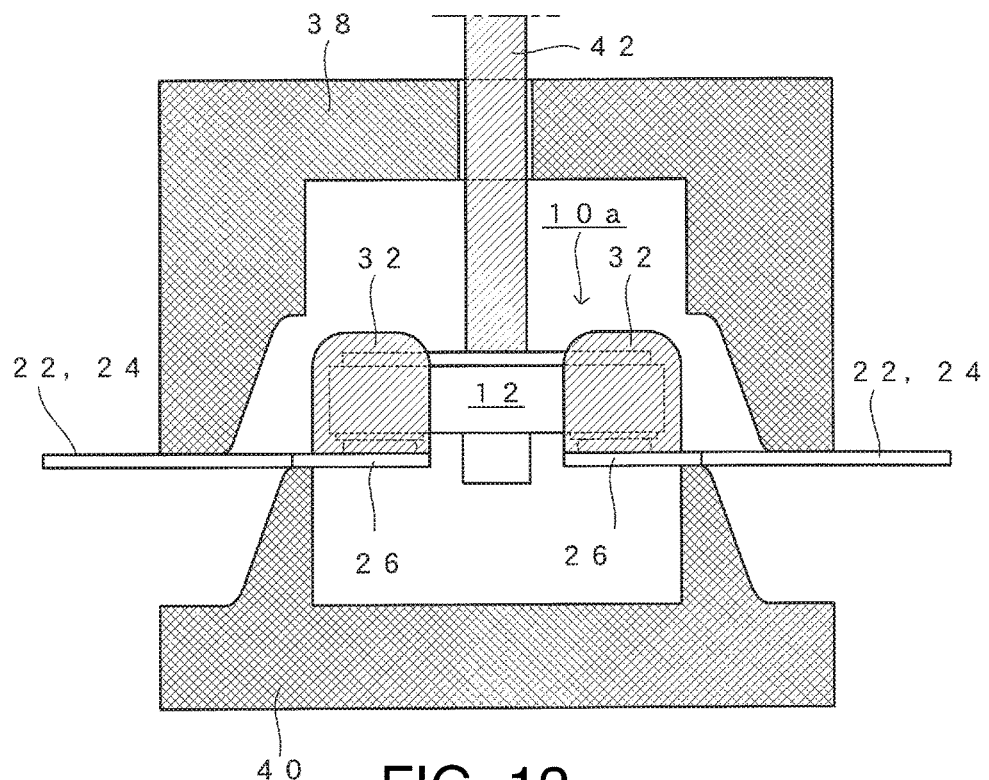
FIG. 12 shows a manufacturing step (arrangement between dies) of the electronic device of the second embodiment.
Figure 13:
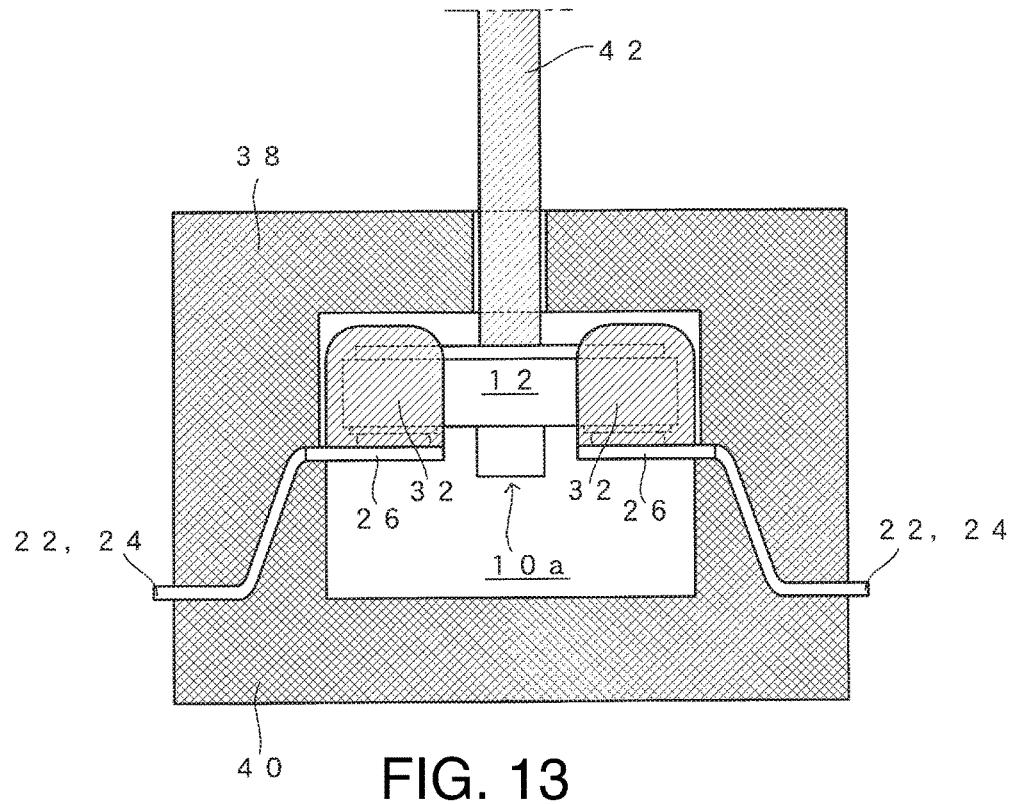
FIG. 13 shows a manufacturing step (bending of a lead frame) of the electronic device of the second embodiment.

FIGS. 12 and 13 show manufacturing steps of the electronic device of the second embodiment. In the manufacturing steps of the electronic device 10a of the second embodiment, the connection between the electronic component 12 and the lead frames 22, and the like are first performed similarly to FIGS. 4 to 7. However, the resin 32 is applied in an integral manner not only between the electronic component 12 and the pad 26 but also to the side surface around the corner portion of the electronic component 12 and a portion of the upper surface thereof, and in this state, thermal curing is performed.

Then, as shown in FIG. 12, the electronic device is arranged between the die 38 and the die 40 in the same manner as described above. As shown in FIG. 13, a force is applied in the direction in which the die 38 and the die 40 are mated with each other to deform the lead frame 22, so that the electronic device 10a is formed. However, the lead frame 22 is bent so as to have an obtuse angle on the side thereof where the resin 32 is applied, which is opposite side from the first embodiment. Also in this case, although the lead frame 22 can be bent at the boundary between the pad 26 and the lead portion 24, the lead frame 22 can be bent at a portion overlapping the external shape line of the resin 32 in plan view, similarly to the first embodiment. Even with this way of bending, the lead frame 22 can be easily bent without applying a mechanical load to the conductive bonding member 30.

In any of the embodiments, a multistage electronic device can be constructed by further stacking the same type of electronic device as the electronic device 10 or 10a of the embodiment on the electronic component 12. The embodiments have been described in which the pad 26 is arranged such that the external shape thereof includes therein the external shape of the external connection terminal 20 in plan view. However, the external connection terminal 20 may be arranged such that a portion of the external shape thereof protrudes from the external shape of the pad 26 in plan view. Further, the embodiments have been described in which the lead frame 22 is used as an example of a metal member. However, the metal member is not limited to the lead frame 22, and may be configured using a rod-like member, a plate-like member, a member obtained by combining a rod-like structure with a plate-like structure, or the like.

Electronic Apparatus and Moving Object

Figure 14:
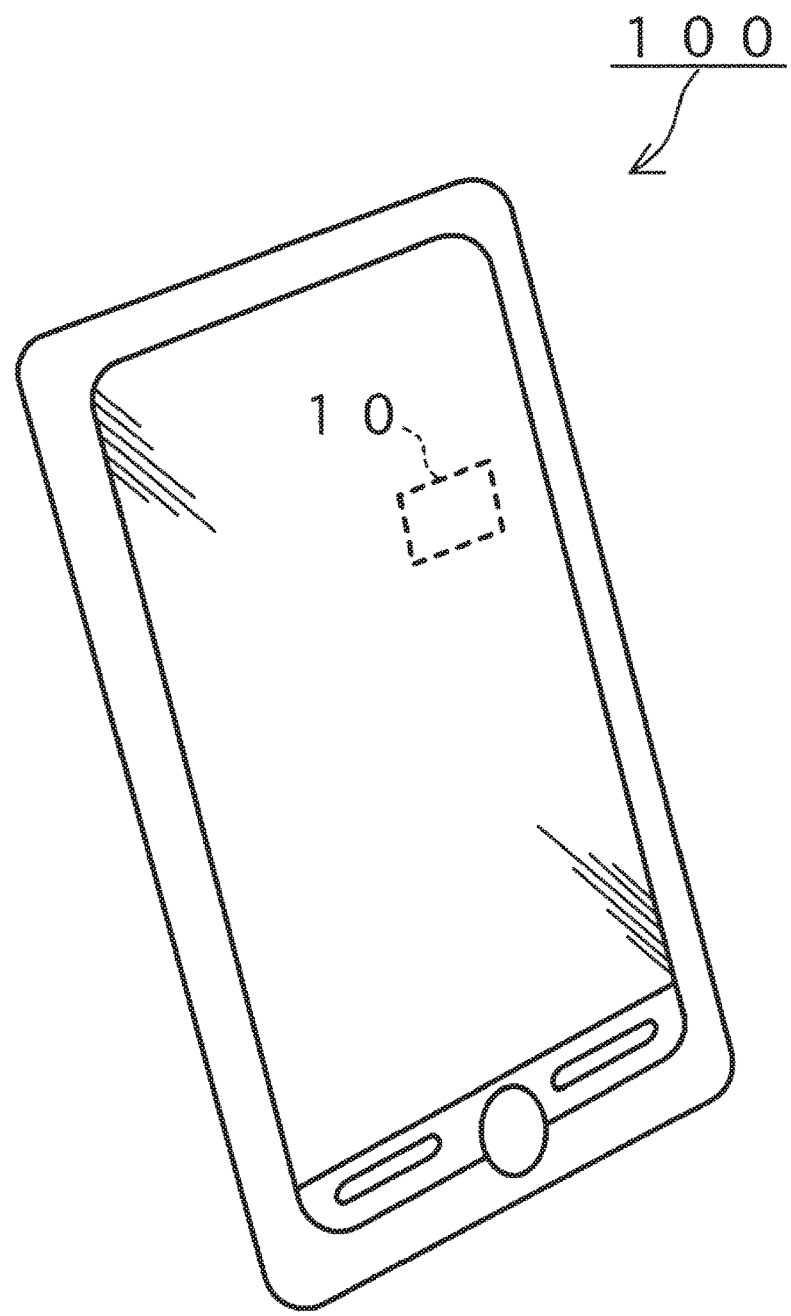
FIG. 14 is a schematic view of an electronic apparatus in which the electronic device of the embodiment is mounted.
Figure 15:
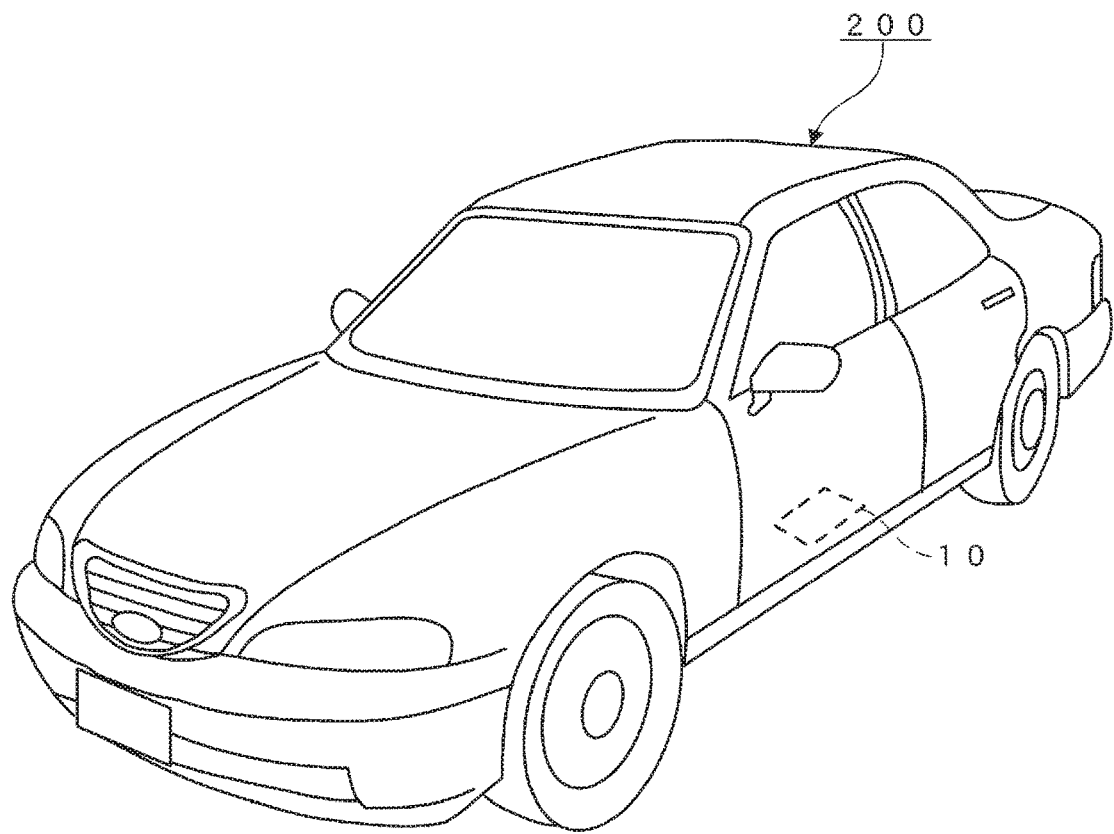
FIG. 15 is a schematic view of a moving object in which the electronic device of the embodiment is mounted.

FIG. 14 is a schematic view of an electronic apparatus (highly functional mobile phone) in which the electronic device of the embodiment is mounted. FIG. 15 is a schematic view of a moving object (automobile) in which the electronic device of the embodiment is mounted. As shown in FIG. 14, for example, an angular velocity sensor (not shown) that detects the attitude of the highly functional mobile phone 100 is incorporated in the highly functional mobile phone 100. As a clock source for operating a control mechanism of the angular velocity sensor, the electronic device 10 or 10a of the embodiment can be used. In addition, the electronic device 10 or 10a of the embodiment can be used as a clock source of an electronic apparatus such as a digital still camera, a mobile phone, a portable game console, a game controller, a car navigation system, a pointing device, a head-mounted display, or a tablet personal computer. As shown in FIG. 15, an automobile 200 includes, for example, a control mechanism (not shown) for stabilizing the attitude of the automobile body. As a clock source for operating the control mechanism, the electronic device 10 or 10a of the embodiment can be used.

What is claimed is:

1. An electronic device comprising:
   an electronic component including external connection terminals; and
   metal members each connected to an associated external connection terminal of the external connection terminals, wherein
      each of the metal members has an elongated lead portion having a connecting portion, and a pad,
      the connecting portion connects the elongated lead portion to the pad and is bent,
      each pad has a longer width than the elongated lead portion in a direction perpendicular to an elongated direction,
      each pad overlaps its associated external connection terminal in plan view,
      at least a portion of each pad is located outside the external shape of the electronic component in plan view,
      each pad and its associated external connection terminal are connected by means of a conductive bonding member,
      each pad and the electronic component are bonded together with a resin,
      the resin extends to a region of each pad located outside the external shape of the electronic component in plan view,
      a portion of the external shape of the resin extends along the external shape of each pad that overlaps the electronic component in plan view and forms a fillet associated with each pad, thereby forming multiple spaced apart fillets, and
      a surface of the electronic component, on which the external connection terminals are provided, is exposed without resin thereon between the fillets.

2. The electronic device according to claim 1, wherein the electronic component contains corners and each pad overlaps a different corner of the electronic component in plan view.

3. The electronic device according to claim 1, wherein
   the external connection terminals are spaced apart from each other,
   the pads are spaced apart from each other, and
   each pad overlaps an edge of the electronic component.

4. The electronic device according to claim 1, wherein each fillet has a curved surface shape.

5. The electronic device according to claim 4, wherein the surface of each fillet is a concave curved surface.

6. The electronic device according to claim 1, wherein
   each pad comprises two intersecting surfaces with intersecting edges, portions of each of which are spaced from the edges of the electronic component in plan view, and
   the fillet associated with each pad extends along the intersecting edges.

7. A device connected to an electronic component including external connection terminals comprising:
   metal members each connected to an associated external connection terminal of the external connection terminals of the electronic component, wherein
      each of the metal members has an elongated lead portion having a connecting portion, and a pad,
      the connecting portion connects the elongated lead portion to the pad and is bent,
      each pad has a longer width than the elongated lead portion in a direction perpendicular to an elongated direction,
      each pad overlaps its associated external connection terminal in plan view, and
      at least a portion of each pad is located outside the external shape of the electronic component in plan view,
   conductive bonding members, each connecting one of the pads and its associated external connection terminal; and
   a resin bonding together each pad and the electronic component, wherein
      the resin extends to a region of each pad located outside the external shape of the electronic component in plan view,
      a portion of the external shape of the resin extends along the external shape of each pad that overlaps the electronic component in plan view and forms a fillet associated with each pad, thereby forming multiple spaced apart fillets, and
      a surface of the electronic component, on which the external connection terminals are provided, is exposed without resin thereon between the fillets.

8. The device according to claim 7, wherein the electronic component contains corners and each pad overlaps a different corner of the electronic component in plan view.

9. The device according to claim 7, wherein
   the external connection terminals are spaced apart from each other,
   the pads are spaced apart from each other, and
   each pad overlaps an edge of the electronic component.

10. The device according to claim 7, wherein each fillet has a curved surface shape.

11. The device according to claim 10, wherein the surface of each fillet is a concave curved surface.

12. The device according to claim 7, wherein
each pad comprises two intersecting surfaces with intersecting edges, portions of each of which are spaced from the edges of the electronic component in plan view, and
the fillet associated with each pad extends along both intersecting edges.

* * * * *